US006560871B1

(12) United States Patent
Ramos et al.

(10) Patent No.: US 6,560,871 B1
(45) Date of Patent: May 13, 2003

(54) SEMICONDUCTOR SUBSTRATE HAVING INCREASED FACTURE STRENGTH AND METHOD OF FORMING THE SAME

(75) Inventors: David O. Ramos, Isabela, PR (US); Martin Bresciani, Guaynabo, PR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/532,105

(22) Filed: Mar. 21, 2000

(51) Int. Cl.[7] .......................... B21D 53/76; H01L 21/02

(52) U.S. Cl. ................................ 29/890.1; 29/DIG. 16; 29/DIG. 26; 438/4; 438/21; 216/52; 216/2; 216/27; 347/54; 347/61

(58) Field of Search ................................ 29/890.1, 611, 29/25.35, 830, DIG. 16, DIG. 26; 438/4, 21, 753; 216/52, 53, 2, 27, 87, 99; 451/29–31, 38; 347/44, 54, 61

(56) References Cited

U.S. PATENT DOCUMENTS

| | | | | |
|---|---|---|---|---|
| 5,122,481 A | * | 6/1992 | Nishiguchi | 216/52 X |
| 5,387,314 A | | 2/1995 | Baughman et al. | 156/643 |
| 5,787,558 A | * | 8/1998 | Murphy | 29/25.35 |

FOREIGN PATENT DOCUMENTS

| | | | | |
|---|---|---|---|---|
| EP | 0749835 A2 | | 12/1996 | |
| EP | 0887187 A2 | | 12/1998 | |
| JP | 54-59197 | * | 5/1979 | 438/753 X |
| JP | 5-152611 | * | 6/1993 | |

OTHER PUBLICATIONS

Patent Abstract of Japan: Publication No. : 2000–031115; Publication Date: Jan. 28, 2000; International Class: H01L 21/306; Application No.: 11–178612; Applicant: Lucent Technol Inc; Filing Date: Jun. 24, 1999; Inventor: Francis M. Mes; Title: “Method for Forming Chip From Wafer”.

Patent Abstracts of Japan; Publication No.: 11–123824; Publication Date: May 11, 1999; International Class: B41J 2/045; Application No.: 09–291287; Applicant: Seiko Epson Corp; Filing Date: Oct. 23, 1997; Inventor: Fujii Masahiro et al.; Title: “Inkjet Head and Manufacture Thereof”.

Patent Abstracts of Japan; Publication No.: 02–180021; Publication Date: Jul. 12, 1990; International Class: H01L 21/322; Application No.: 64–000143; Applicant: Kawasaki Steel Corp; Filing Date: Jan. 5, 1989; Inventor: Yamada Toshio; Title: “Manufacture of Semiconductor Wafer”.

Patent Abstracts of Japan; Publication No.: 10–202889; Publication Date: Aug. 4, 1998; International Class: B41J 2/16; Application No.: 09–011026; Applicant: Hitachi Koki Co Ltd; Filing Date: Jan. 24, 1997; Inventor: Yamada Kenji, et al.; Title: “Fabrication of Ink Jet Recording Head and Recorder”.

Patent Abstracts of Japan; Publication No.: 09–207345; Publication Date: Aug. 12, 1997; International Class: B41J 2/16; Application No.: 08–016002; Applicant: Rohm Co Ltd; Filing Date: Jan. 31, 1996; Inventor: Ishida Nobuhisa; Title: “Production of Diaphragm for Ink Jet Print Head”.

Patent Abstracts of Japan; Publication No.: 2001–129998; Publication Date: May 15, 2001; International Class: B41J 2/05; Application No.: 11–311534; Applicant: Casio Comput Co Ltd; Filing Date: Nov. 1, 1999; Inventor: Kumagai Minoru; Title: “Ink–Jet Printer Head and its Manufacturing Method”.

* cited by examiner

*Primary Examiner*—A. Dexter Tugbang

(57) ABSTRACT

A method of processing a semiconductor substrate to increase fracture strength and a semiconductor substrate formed by that method. In a preferred embodiment, the semiconductor substrate is utilized in a printhead. The semiconductor substrate has a feature such as an ink feed channel machined therein, and following machining the die is processed to remove material adjacent the machined feature to reduce micro-cracks or other defects that may have been created during the feature machining process. The crack containing material may be removed by several procedures. A preferred procedure is etching with a solution containing TMAH.

17 Claims, 3 Drawing Sheets

SEMICONDUCTOR SUBSTRATE HAVING INCREASED FACTURE STRENGTH AND METHOD OF FORMING THE SAME

FIELD OF THE INVENTION

The present invention relates to increasing the fracture strength of semiconductor substrates used in inkjet printheads and the like, and more generally, to increasing the fracture strength of semiconductor substrates, regardless of intended purpose, that are drilled or otherwise machined to form a hole or other feature therethrough or therein.

BACKGROUND OF THE INVENTION

Various inkjet printing arrangements are known in the art and include both thermally actuated printheads and mechanically actuated printheads. Thermal actuated printheads tend to use resistive elements or the like to achieve ink expulsion, while mechanically actuated printheads tend to use piezoelectric transducers or the like.

A representative thermal inkjet printhead has a plurality of thin film resistors provided on a semiconductor substrate. A nozzle plate and barrier layer are provided on the substrate and define the firing chambers about each of the resistors. Propagation of a current or a "fire signal" through a resistor causes ink in the corresponding firing chamber to be heated and expelled through the appropriate nozzle.

Ink is typically delivered to the firing chamber through a feed slot that is machined in the semiconductor substrate. The substrate usually has a rectangular shape, with the slot disposed longitudinally therein. Resistors are typically arranged in rows located on both sides of the slot and are preferably spaced an approximately equal distances from the slot so that the ink channel length at each resistor is approximately equal. The width of the print swath achieved by one pass of a printhead is approximately equal to the length of the resistor rows, which in turn is approximately equal to the length of the slot.

Feed slots are typically formed by sand drilling (also known as "sand slotting"). This method is preferred because it is a rapid, relatively simple and scalable (many substrates may be processed simultaneously) process. While sand slotting affords these apparent benefits, sand slotting is also disadvantageous in that it causes micro cracks in the semiconductor substrate that significantly reduce the substrates fracture strength, resulting in significant yield loss due to cracked die. Low fracture strength also limits substrate length which in turn adversely impacts print swath height and overall print speed.

As new printer systems are developed, a key performance parameter is print speed. One way of achieving higher print speed is to increase the width of the print swath of a printhead. One potential manner of increasing print swath width is to increase the length of the substrate and the feed slot therein. Due to micro cracks and other structural defects induced during sand slotting, however, substrates are rendered too fragile to be further extended.

A need thus exists for a machined semiconductor substrate that has increased fracture strength to better withstand the thermal and mechanical stresses induced in ink jet printhead manufacture and use. A need also exists for a printhead semiconductor substrate that has increased fracture strength and can therefore be elongated to achieve longer print swath width. A need further exists for a machined semiconductor substrate for any intended purpose that has increased fracture strength.

SUMMARY OF THE INVENTION

One aspect of the present invention is a semiconductor substrate and method of making the same having improved fracture strength. A semiconductor substrate is machined to define a feature therein. The machining process forms a micro-crack in the substrate that reduces the fracture strength of the substrate. The semiconductor substrate is processed to remove portions of the substrate proximate the micro-cracks to improve the fracture strength of the semiconductor substrate.

In one preferred embodiment, the portions of the semiconductor substrate proximate the micro-cracks are removed to increase the radius of curvature of portions of the crack using an etching process.

DETAILED DESCRIPTION

Figure 1:
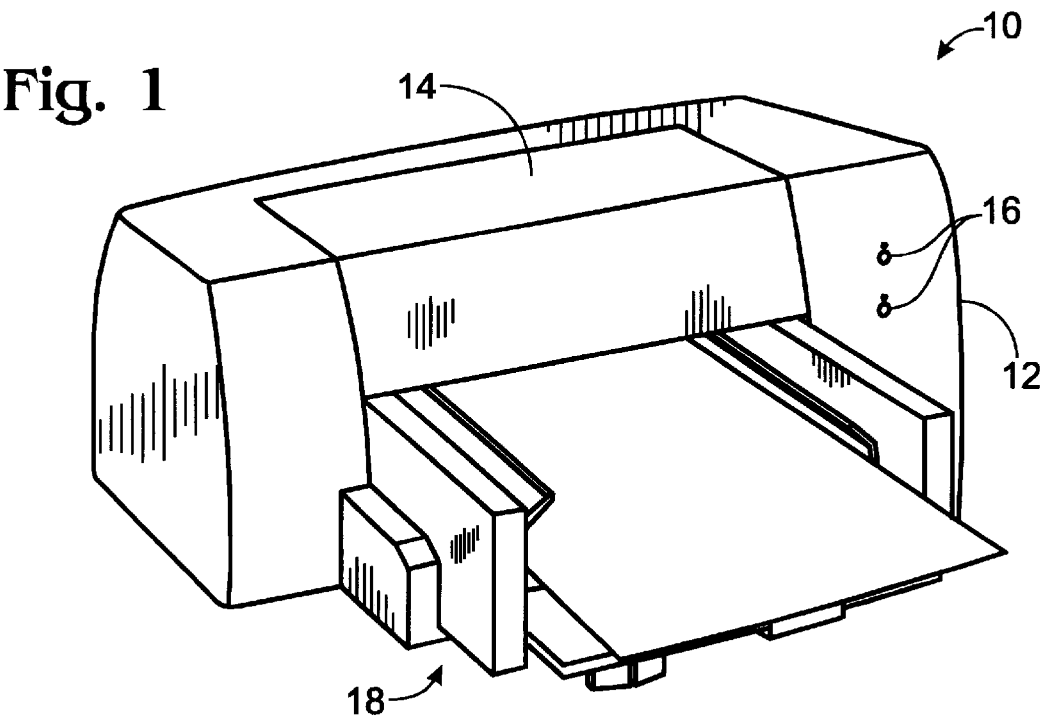
FIG. 1 is a perspective view of an ink jet printer in accordance with the present invention.

Referring to FIG. 1, a perspective view of an ink jet printer in accordance with the present invention is shown. Printer 10 preferably includes a housing 12 having an openable cover 14 and printer status indicator lights 16. A printhead (discussed in more detail below) is preferably located under cover 14. A print media input/output (I/O) unit 18 provides suitable print media to the printhead(s). The print media I/O unit preferably includes paper input and output trays, guides, and appropriate sensors and transport mechanisms, etc. Printer 10 also includes a power supply, an ink supply and controller logic (not shown), amongst other related components. The power supply preferably provides regulated DC at appropriate voltage levels.

The ink supply may be formed integrally with printhead 10 or formed separately. The ink supply may be separately replaceable from the printhead or replaceable with the printhead. Ink level detection logic (not shown) is preferably provided with the ink supply to indicate an ink volume level. Suitable ink supply arrangements are known in the art.

Printer 10 preferably receives print data from a host machine which may be a computer, facsimile machine, Internet terminal, camera, plotter or other device that is capable of propagating print data to printer 10.

The printhead is preferably provided on a moveable carriage (also located under cover 14) that may move transversely along guide rods as is known. It should be recognized, however, that the printhead could be stationary and, for example, formed as wide as a sheet (or section of a sheet) of print media, such as paper.

Figure 2:
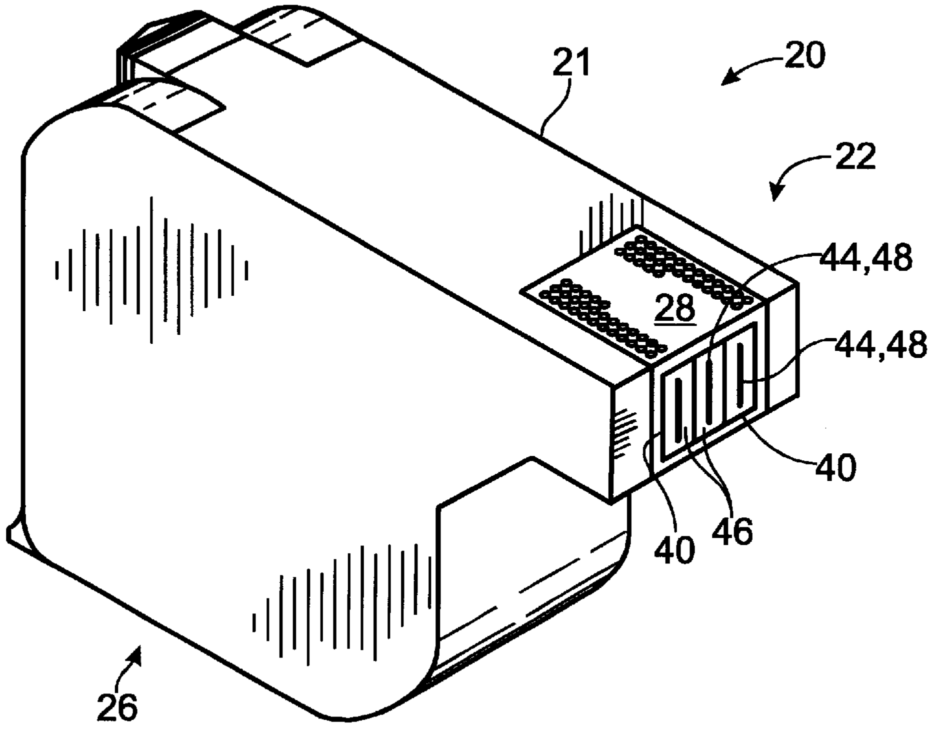
FIG. 2 is a perspective view of one embodiment of an ink jet print cartridge in accordance with the present invention.

Referring to FIG. 2, one embodiment of an ink jet print cartridge in accordance with the present invention is shown.

Print cartridge 20 includes a housing 21 that is configured to provide a printhead region 22 and a reservoir region 26. In the embodiment of FIG. 2, print cartridge 20 is a tri-color print cartridge having three ink feed slots and corresponding arrays of nozzles, preferably for cyan, magenta and yellow. The reservoir region 26 in the case of a color print cartridge 20, preferably includes individual ink reservoirs for each different color of ink. It should be recognized that print cartridge 20 may alternatively be configured for use with an "off-axis" ink supply that is physically detached from the printhead and in fluid communication therewith.

Figure 3:
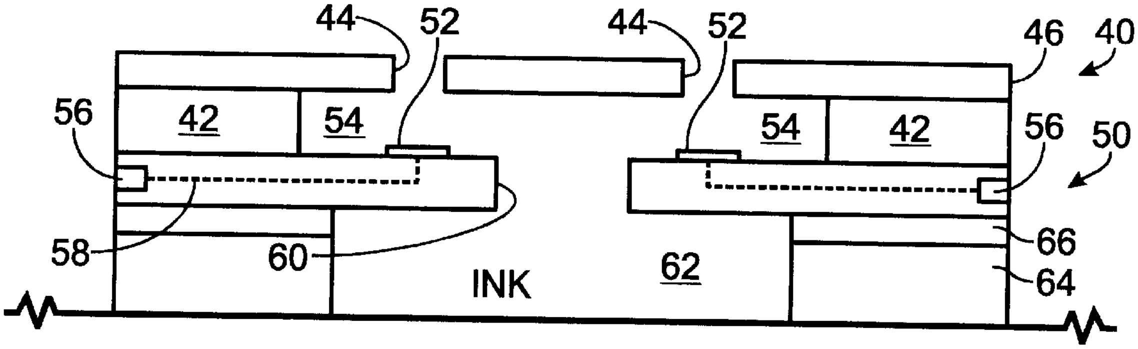
FIG. 3 is a cross-sectional view of the printhead of FIG. 2 having a semiconductor substrate processed in accordance with the present invention.
Figure 4:
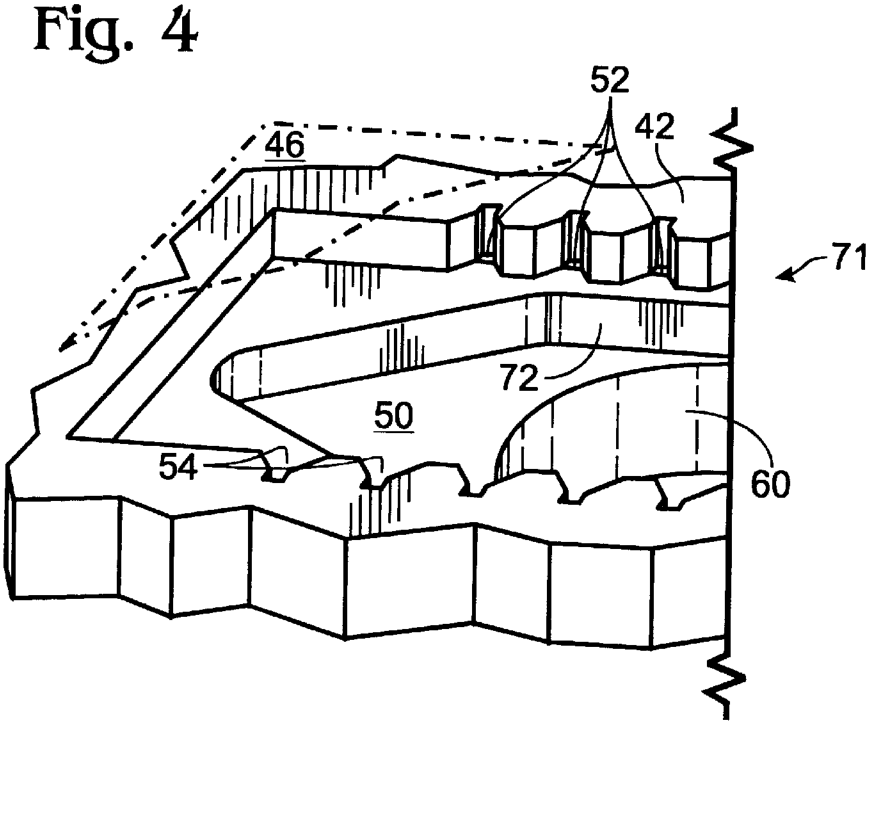
FIG. 4 is a perspective, cut-away view of one end of the ink feed slot in a semiconductor substrate in accordance with the present invention.
Figure 5:
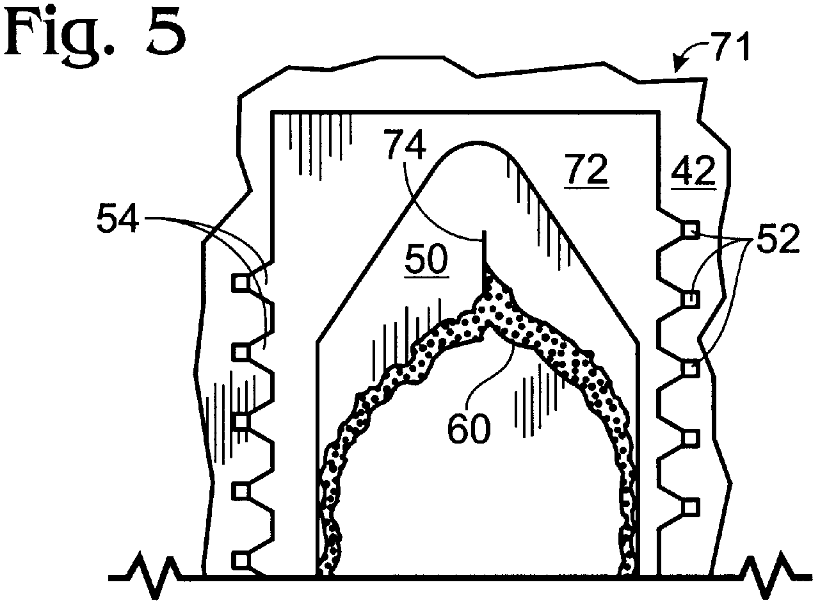
FIG. 5 is a plan view of one end of the ink feed slot formed by sand slotting in a typical printhead substrate illustrating a micro-crack.

Each printhead 40 preferably includes a substrate 50 on which one or more ink feed slots 60 is machined (see FIGS. 3–5). Ink is delivered (from an on-axis or off-axis source) through the feed slot 60 to ink expulsion elements 52 formed proximate the slot. The ink expulsion elements (e.g., resistor, piezo-electric transducer, etc.) are preferably provided in two rows, and are located on opposite sides of the feed slot (see FIGS. 3 and 4). Nozzles 44, are aligned with the corresponding ink expulsion elements 52 and are formed in a nozzle plate 46. A plurality of electrical interconnects 28 are coupled to the substrate 50 by conductive drive lines (not shown). The electrical interconnects 28 engage a corresponding electrical interconnect which is located in the printer carriage (discussed above), thereby allowing printer 10 to selectively control the ejection of ink droplets as a cartridge traverses across the print media.

Referring to FIG. 3, a cross-sectional view of the printhead 40 of FIG. 2 having a semiconductor substrate processed in accordance with the present invention is shown. Ink enters chamber 62 from a reservoir within region 26 or a feed conduit from an off-axis source as discussed above. Components 64 represent portions of housing 21 of print cartridge 20 (or of a suitable conduit) that are preferably joined to substrate 50 by thermally cured structural adhesive 66. Ink in chamber 62 flows through feed slot 60 to firing chamber 54 formed adjacent ink expulsion elements 52.

Contact pads 56 propagate fire or drive signals from interconnects 28 via signal traces 58 to the ink expulsion elements 52. In a preferred embodiment, the ink expulsion elements are thin film resistors of a type known in the art, though it should be recognized that the ink expulsion elements may alternatively be piezo-electric transducers, etc.

The substrate 50 is preferably formed of a semiconductor material such as silicon. Barrier layer 42 is formed on the substrate in such a manner as to define firing chambers 54 (see FIG. 4), and a nozzle plate 46 is mounted on the barrier layer such that nozzles 44 and their associated ink expulsion resistors 52 are appropriately aligned.

Referring to FIG. 4, a perspective, cut-away view of one end of the ink feed slot 60 that is formed using a machining technique such as sand drilling is shown. This figure depicts the details of the inkfeed slot 60, firing chambers 54, resistors 52, barrier structure 42, and orifice plate 46.

The formation of the feed slot 60 in substrate 50 has been described in many publications including U.S. Pat. No. 4,680,859 to Johnson, entitled "Thermal Inkjet Print Head Method of Manufacture" and assigned to the present assignee. During the slot 60 formation process, the nozzle of the slotting tool is brought into close proximity with the back of the substrate 50 and high pressure abrasive particles strike the substrate 50. Due to the random nature of the abrasive striking the substrate 50, the size and shape of the slot 60 is difficult to control. In addition, the point at which the slot 60 "breaks through" the front of the substrate 50 also varies and depending upon this location micro-cracks can be formed in the substrate 50. Tests have shown that if the slot 60 breaks through the center of the substrate 50 that stress cracks form at the ends of the ink feed slot 60. These micro-cracks act as fracture initiation sites and can cause the die to fracture when it is placed under the mechanical and thermal stress such as during the manufacturing process.

FIG. 5 depicts a plan view of a representative printhead substrate 50 with a typical micro-crack 74 that as formed in the silicon substrate as a result of the lot 60 formation process. As can be seen, micro-crack 74 and similar cracks form at an end of the elongated feed slot 60 and tend to follow the crystalline grain boundaries that are parallel to an axis of elongation of the ink feed slot 60. As the substrate 50 is stressed either thermally or mechanically, the crack 74 readily increases until substrate 50 fractures. Once the substrate 50 is fractured the electrical traces 58 and active components on the substrate 50 are broken resulting in printhead 40 failure.

There has been a great deal of effort spent on making the slotting process more repeatable and controllable, and in eliminating these micro-cracks 74. Up to the present invention, however, there has not been a complete solution to the die fracture problem.

Accordingly, to improve fracture strength, substrate 50 is preferably etched after machining to remove portions of the semiconductor material where the micro-cracks are formed. This etching process changes the nature of the semiconductor material such that the line of the micro-crack is modified. One modification to the micro-crack performed by the etch process is to alter the terminus of the end point of the crack.

Figure 6A:
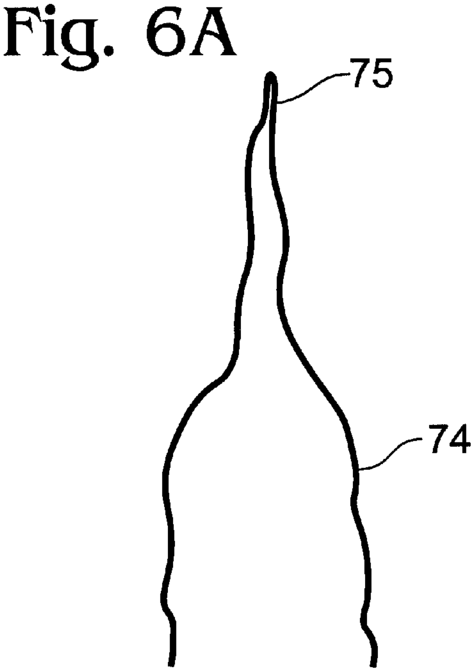
FIGS. 6A and 6B is a greatly enlarged representation of the micro-crack of FIG. 5 shown before, FIG. 6A, and after, FIG. 6*b*, performing the method of the present invention.
Figure 6B:
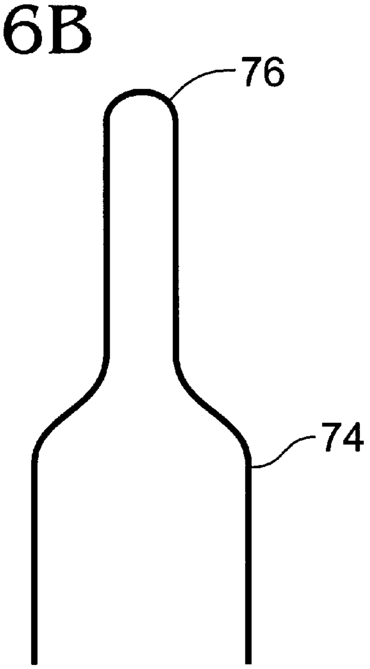

Referring to FIGS. 6A and 6B, there is shown a greatly enlarged representation of the micro-crack 74 shown in FIG. 5. FIG. 6A is a representative of the micro-crack 74 before processing using the etching process of the present invention. The micro-crack 74 has a terminus 75 which tends to be a point in the substrate 50 where mechanical stress applied to the substrate 50 becomes focused or concentrated. In contrast, FIG. 6B is a representation of the micro-crack 74 of FIG. 6A after processing using the etching process of the present invention. The terminus 76 of the micro-crack 74 is modified by the etch process to have an increased radius of curvature. The stress concentration within the substrate 50 is proportional to 1/(radius of curvature). Thus increasing the radius of curvature using the etch process of the present invention reduces the stress concentration and the likelihood of further cracking. The etching process of the present invention not only increases the radius of curvature at the terminus 76, but also throughout the micro-crack 74. The etching process of the present invention tends to increase the critical radius or radius of curvature of the micro-cracks 74 and this in turn reduces the stress concentration in the substrate 50.

Substrate 50 and printhead 40 in which the substrate is utilized is preferably made as follows. Printhead circuitry for a plurality of printhead substrates is formed on a wafer. Standard thin film techniques are preferably utilized to form the printhead substrate conductive patterns. Following this fabrication, the wafer is cleaned and prepared for barrier layer mounting. The barrier layer is typically formed by a polymer lamination process.

After barrier layer 42 formation, the ink feed slot is sand drilled as described above for each of the plurality of printhead substrate 50 on the wafer. This sand drill process tends to form small cracks 74 that tend to reduce the fracture strength of the substrate 50.

The preferred etch process is then performed to improve the fracture strength of the substrate 50. This process is performed by rinsing the wafer preferably in a BOE bath for 3.5 minutes at 20.9° C. to remove naturally grown $Sio_2$ (72 of FIG. 4). After a deionized water rinse, the wafer is etched in 5% wt. TMAH for 7 minutes at 84.9° C. This etch is followed by another deionized water rinse and the mounting of individual orifice plates (46 of FIGS. 2–3) on the barrier layer 42 material. The wafer is then singulated to produce a plurality of printhead substrates 50 that each exhibit increased fracture strength. A flex circuit having interconnects 28 may be connected to each substrate to produce a printhead sub-assembly. The printhead head assembly is then attached to the printhead housing or structure 64 with a thermally cured adhesive 66 to completes the "dry portion" of the printhead assembly process.

By processing substrate 50 as discussed above or in a related manner, a printhead 40 is produced that has increased fracture strength. The increased fracture strength in turn results in less substrate cracking during manufacture thereby increasing production yield and product life. In addition, increased fracture strength allows larger printheads 40 having longer ink feed slots 60 allowing larger print swaths to be printed. The ability to print larger print swaths enables greater printing speed and greater through put for the printing system 10.

In an alternate embodiment, the etch is performed after the wafer is singulated with a diamond saw. The edges of the die are typically chipped and cracked due to the shear loads induced by the cutting of the rotary blade. These chipped areas typically include cracks which under thermal and mechanical loads can propagate into the die. Performing an etch on these die has been show to remove these local cracks resulting in a more fracture resistant and manufacturable substrate.

Another benefit related to the use of TMAH and like substances is that TMAH is an anisotropic etch (i.e., etches more rapidly in certain crystalline orientations than in others) and as such tends to form pyramidal shaped recesses in the monocrystalline silicon material 50. This characteristic pattern provides a way of easily determining whether a die has been etched.

With respect to alternatives for TMAH, it should be recognized that Si material may also be removed with KOH or other similarly acting chemical echants.

Although etching is a preferred manner for removal of crack containing material, other techniques also fall within the spirit and scope of the present invention including re-heating or re-melting techniques and laser annealing.

What is claimed is:

1. A method of processing a semiconductor substrate, comprising the steps of:

machining the semiconductor substrate to define a feature therein, a machining process forming cracks that reduce a fracture strength of the substrate; and removing portions of the said semiconductor substrate proximate said cracks so as to improve the fracture strength of the substrate;

wherein said removing step comprises increasing a radius of at least one of the cracks.

2. The method of claim 1, wherein said removing step comprises removing at least one of the cracks.

3. The method of claim 1, wherein said removing step further comprises a step of etching said semiconductor substrate proximate said feature.

4. The method of claim 3, wherein said etching step includes the step of etching with a solution containing TMAH or KOH.

5. The method of claim 4, wherein said etching step includes the step of etching with said TMAH solution for approximately 2–20 minutes.

6. The method of claim 5, wherein said TMAH etching step includes the step of etching with a solution that is less than 25% by weight TMAH.

7. The method of claim 1, wherein said removing step includes at least one step of the group of steps including:

etching;

re-melting and laser anealing said semiconductor substrate.

8. The method of claim 1, further comprising the step of conducting an $SiO_2$ removal process prior to said semiconductor substrate material removal step.

9. The method of claim 1, further comprising the steps of:

mounting a barrier layer on said substrate; and attaching a nozzle plate on said barrier layer.

10. A method of manufacturing a printhead, comprising the steps of:

fabricating printhead circuitry on a semiconductor substrate;

machining an ink feed channel in that substrate proximate the printhead circuitry,the machining process forming cracks that reduce a fracture strength of the substrate;

mounting a barrier layer over said substrate;

removing portions of said substrate proximate said cracks so as to improve the fracture strength of the substrate; and attaching a nozzle plate on said barrier layer.

11. The method of claim 10, wherein said removal processing step includes at least one step from the group of steps including:

etching;

re-melting; and laser annealing said semiconductor substrate.

12. The method of claim 10, wherein said removal processing step includes the step of etching said semiconductor substrate to remove semiconductor material adjacent said feature.

13. The method of claim 12, wherein said etching step includes the step of etching with a TMAH solution.

14. The method of claim 13, wherein said TMAH etching step includes the step of etching from 2 to 20 minutes.

15. The method of claim 12, wherein said etching step includes the step of etching after the barrier layer has been mounted on the substrate.

16. The method of claim 12, wherein said etching step includes the step of etching before the barrier layer is mounted on the substrate.

17. The method of claim 12, wherein said etching step includes the step of etching after an orifice plate has been attached.

* * * * *